US 9,401,683 B2

(12) United States Patent
Inoue (10) Patent No.: US 9,401,683 B2
(45) Date of Patent: Jul. 26, 2016

(54) VEHICULAR ACTIVE SOUND EFFECT GENERATING APPARATUS

(71) Applicant: Honda Motor Co., Ltd., Tokyo (JP)

(72) Inventor: Toshio Inoue, Tochigi-ken (JP)

(73) Assignee: Honda Motor Co., Ltd., Tokyo (JP)

( * ) Notice: Subject to any disclaimer, the term of this patent is extended or adjusted under 35 U.S.C. 154(b) by 305 days.

(21) Appl. No.: 13/761,963

(22) Filed: Feb. 7, 2013

(65) Prior Publication Data

US 2013/0216054 A1  Aug. 22, 2013

(30) Foreign Application Priority Data

Feb. 17, 2012  (JP) ................................ 2012-032555

(51) Int. Cl.
*H03G 3/00* (2006.01)
*G10K 15/02* (2006.01)
*H04R 3/12* (2006.01)

(52) U.S. Cl.
CPC ................ *H03G 3/00* (2013.01); *G10K 15/02* (2013.01); *H04R 3/12* (2013.01); *H04R 2499/13* (2013.01)

(58) Field of Classification Search
USPC ........ 381/86, 302, 61, 111, 116, 120, 307, 59
See application file for complete search history.

(56) References Cited

U.S. PATENT DOCUMENTS

| | | | |
|---|---|---|---|
| 4,991,218 A | 2/1991 | Kramer | |
| 5,692,052 A | 11/1997 | Tanaka et al. | |
| 5,835,605 A | 11/1998 | Kunimoto | |
| 6,944,303 B2 | 9/2005 | Akiho | |
| 7,062,049 B1 | 6/2006 | Inoue et al. | |
| 7,352,859 B2 | 4/2008 | Dedieu et al. | |
| 7,352,869 B2 | 4/2008 | Inoue et al. | |
| 7,606,374 B2 | 10/2009 | Maeda | |
| 2004/0247137 A1 | 12/2004 | Inoue et al. | |
| 2005/0094826 A1 | 5/2005 | Morishita | |
| 2006/0177797 A1 | 8/2006 | Costello et al. | |
| 2006/0215846 A1 | 9/2006 | Kobayashi et al. | |
| 2008/0310642 A1* | 12/2008 | Sakamoto | G10K 15/02 381/61 |
| 2009/0028353 A1* | 1/2009 | Kobayashi | A63G 31/16 381/61 |
| 2009/0052682 A1 | 2/2009 | Kuroiwa | |
| 2011/0087403 A1 | 4/2011 | Fujikawa | |
| 2011/0216916 A1* | 9/2011 | Hera | G10K 15/02 381/86 |

FOREIGN PATENT DOCUMENTS

| | | |
|---|---|---|
| CN | 2750414 Y | 1/2006 |
| CN | 201721384 U | 1/2011 |
| CN | 102044240 A | 5/2011 |
| JP | 02-158296 A | 6/1990 |
| JP | 2006-298111 A | 11/2006 |
| JP | 2008068681 A | 3/2008 |
| WO | 2011109156 A1 | 9/2011 |

OTHER PUBLICATIONS

Notice of Allowance issued in U.S. Appl. No. 12/041,990, mailed Jun. 14, 2013, 11 pages.
Search Report issued in European Patent Application No. 13 15 5052, mailed May 27, 2013, 4 pages.
Notice of Allowance dated Jul. 28, 2015, issued over the corresponding JP Patent Application No. 2012-032555 with the English translation of pertinent portion.
Front page of corresponding Chinese Patent Publication No. CN103253185B issued on May 13, 2015 with bibliographic data and English translation thereof.

* cited by examiner

*Primary Examiner* — Duc Nguyen
*Assistant Examiner* — Yogeshkumar Patel
(74) *Attorney, Agent, or Firm* — Carrier Blackman & Associates, P.C.; William D. Blackman; Jeffrey T. Gedeon (57) ABSTRACT

A sound effect generating apparatus includes a delay unit for giving a delay to a sound effect output from a rear speaker depending on either an accelerator opening change which represents a change per unit time in an accelerator opening or the accelerator opening itself.

6 Claims, 4 Drawing Sheets

VEHICULAR ACTIVE SOUND EFFECT GENERATING APPARATUS

CROSS-REFERENCE TO RELATED APPLICATION

This application is based upon and claims the benefit of priority from Japanese Patent Application No. 2012-032555 filed on Feb. 17, 2012, the contents of which are incorporated herein by reference.

BACKGROUND OF THE INVENTION

1. Field of the Invention

The present invention relates to a vehicular active sound effect generating apparatus for generating a sound effect such as a pseudo-engine sound of a vehicle or the like.

2. Description of the Related Art

Sound effect generating apparatus also referred to as "ASC apparatus (Active Sound Control apparatus)") have been known in the art as apparatus for enhancing the acoustic effect in the passenger compartments of vehicles. See, for example, U.S. Patent Application Publication No. 2008/0310642 (hereinafter referred to as "US2008/0310642A1") and U.S. Patent Application Publication No. 2009/0028353 (hereinafter referred to as "US2009/0028353A1".

US2008/0310642A1 discloses that a delay $Zc2$ produced by a rear speaker $22b$ is made longer than a delay $Zc1$ produced by a front speaker $22a$ (FIGS. 5 through 6D, paragraphs [0085] through [0102]). The lengths of the delays $Zc1$, $Zc2$ may be of not only fixed values, but may be varied depending on an increase or reduction in an engine rotational frequency change $\Delta af$ [Hz/second] or a vehicle speed change [km/hour/second] (paragraphs [0141] through [0144]).

US2009/0028353A1 is aimed at providing an active sound effect generating apparatus which is capable of generating natural sound effects ([0008]). In order to achieve the object, the active sound effect generating apparatus 101 disclosed in US2009/0028353A1 has a control means 201 (fourth acoustic adjustor 54 and fifth acoustic adjustor 55) which adjusts the amplitudes of reference signals Sr1, Sr2, Sr3 (intermediate signals Si4, Si5) depending on an engine rotational frequency change $\Delta af$ [Hz/second] calculated by an engine rotational frequency change calculator 68 and an accelerator opening Aor [%] detected by an accelerator opening sensor 60, for thereby determining the amplitude of a control signal Sc (Abstract).

SUMMARY OF THE INVENTION

According to US2008/0310642A1, as described above, the length of the delay $Zc2$ produced by the rear speaker $22b$ may be varied depending on an increase or reduction in the engine rotational frequency change $\Delta af$ or the vehicle speed change (paragraphs [0141] through [0144]). However, the engine rotational frequency change $\Delta af$ and the vehicle speed change represent vehicle states, and may not necessarily reflect the operation by the driver of the accelerator pedal. For example, when the vehicle runs uphill, even if the driver depresses the accelerator pedal deeply, the engine rotational frequency does not go higher than when the vehicle runs on a flat road. However, US2008/0310642A1 does not deal with such a situation.

US2009/0028353A1 discloses the adjustment of the amplitudes of the reference signals Sr1, Sr2, Sr3 (intermediate signals Si4, Si5) depending on the accelerator opening Aor (Abstract). Such a process is premised on an arrangement wherein a front speaker generates a sound effect (see FIGS. 1, 10, and 15). US2009/0028353A1 is silent about delaying a sound effect generated by a rear speaker.

It is an object of the present invention to provide a sound effect generating apparatus which is capable of appropriately generating a sound effect from a rear speaker.

According to the present invention, there is provided a vehicular active sound effect generating apparatus comprising a waveform data table for storing waveform data of one period, a rotational frequency detecting unit for detecting a rotational frequency of an engine of a vehicle, a reference signal generating unit for generating a harmonic reference signal based on the rotational frequency by reading the waveform data from the waveform data table, a control signal generating unit for generating a control signal to generate a sound effect to be output into a passenger compartment of the vehicle, based on the reference signal, an accelerator opening detecting unit for detecting an accelerator opening of the vehicle, an amplitude-adjusted control signal generating unit for generating an amplitude-adjusted control signal by adjusting an amplitude of the control signal depending on the accelerator opening, a plurality of speakers for outputting the sound effect based on the amplitude-adjusted control signal, wherein the speakers include a front speaker positioned in a front portion of the vehicle and a rear speaker positioned in a rear portion of the vehicle, and a delay unit for giving a delay to a sound effect output from the rear speaker depending on either an accelerator opening change which represents a change per unit time in the accelerator opening or the accelerator opening itself.

According to the present invention, a delay depending on the accelerator opening change or the accelerator opening is given to the sound effect output from the rear speaker. Therefore, it is possible to produce a sound effect that reflects how the accelerator pedal of the vehicle is operated by the driver of the vehicle. For example, if the accelerator opening changes sharply, then the sound effect from the rear speaker is output with a delay with respect to a sound effect from the front speaker, thus outputting a sound effect taking into account the time difference between an intake sound and an exhaust sound and also enhancing a sound source movement feel (acceleration feel) which the driver has.

The delay unit may give a delay having a predetermined amount to the sound effect output from the rear speaker when the accelerator opening change exceeds a threshold value. Thus, a delay can be generated only when the driver depresses the accelerator pedal, for example.

The delay unit may change an amount of the delay given to the sound effect output from the rear speaker, depending on a magnitude of the accelerator opening change. Consequently, it is possible to reflect how the accelerator pedal is operated by the driver on the delay for achieving an enhanced sound effect.

An amplitude of the sound effect output from the rear speaker may be set to a value smaller than an amplitude of a sound effect output from the front speaker. Usually, sounds related to the actual operation of the engine (intake sound, exhaust sound, etc.) are stronger from a front portion of the vehicle than from a rear portion of the vehicle. Therefore, the above amplitude setting makes it possible to produce a natural sound effect.

The amplitude-adjusted control signal generating unit may adjust the amplitude of the control signal depending on the rotational frequency and the accelerator opening. It is thus possible to output a sound effect which reflects both the operating state of the engine and the operated state of the accelerator pedal.

The vehicular active sound effect generating apparatus may further comprise a rotational frequency change calculating unit for calculating a rotational frequency change which represents a change per unit time in the rotational frequency. The amplitude-adjusted control signal generating unit may adjust the amplitude of the control signal depending on the rotational frequency change and the accelerator opening. Therefore, it is possible to output a sound effect which reflects both the operated state of the engine and the operating state of the accelerator pedal.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

[A. Embodiment]
1. Overall and Local Arrangements:
(1-1. Overall Arrangement)

Figure 1:
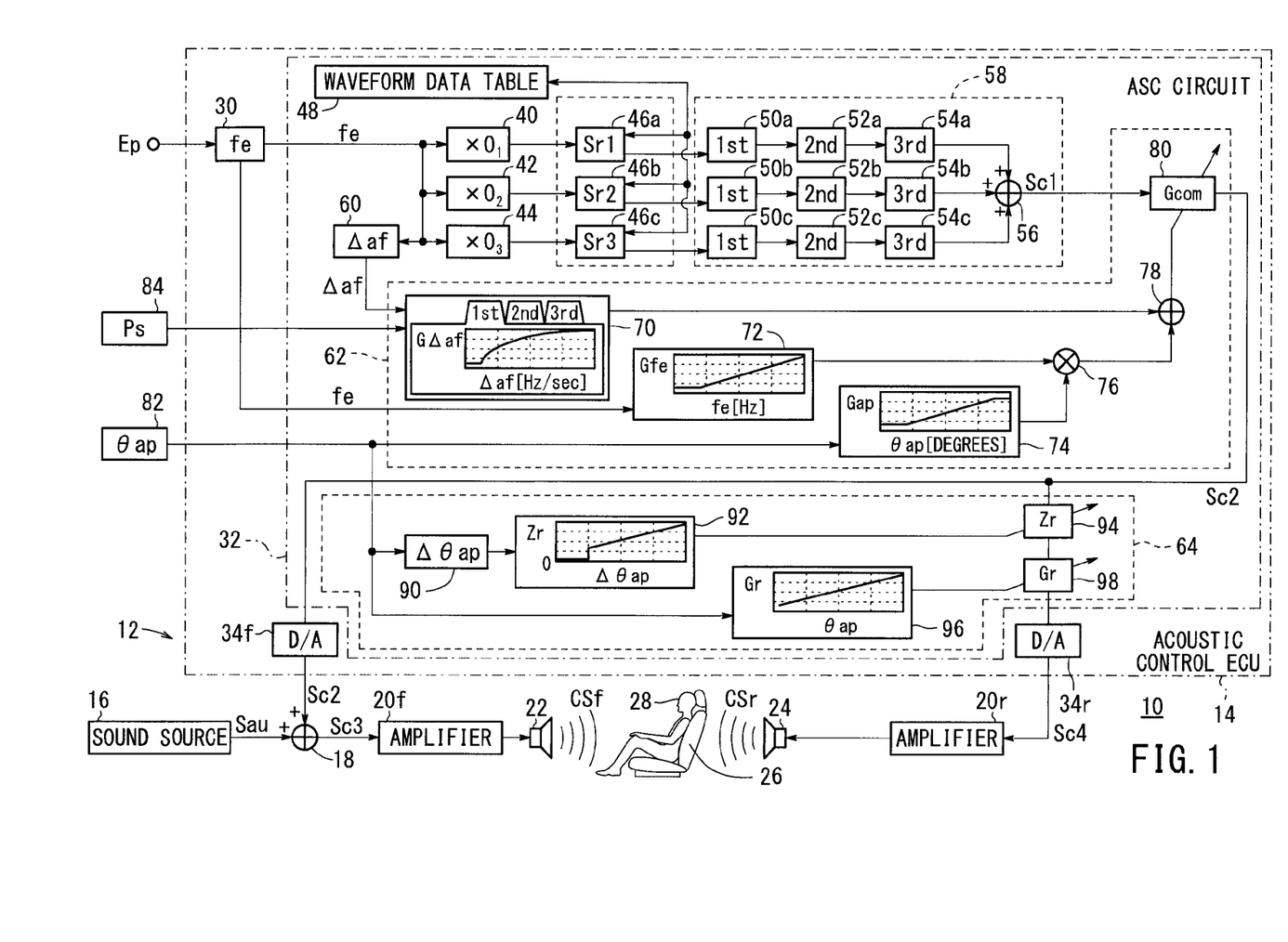
FIG. 1 is a block diagram of a vehicle incorporating an acoustic control electronic control unit (hereinafter referred to as "acoustic control ECU") having the function of a sound effect generating apparatus according to an embodiment of the present invention.

FIG. 1 shows in block form a vehicle 10 incorporating an acoustic control electronic control unit 14 (hereinafter referred to as "acoustic control ECU 14" or "ECU 14") having the function of a sound effect generating apparatus (ASC apparatus) according to an embodiment of the present invention. The vehicle 10 comprises a gasoline-powered vehicle, but may comprise an electric vehicle, a fuel battery vehicle, or the like.

The vehicle 10 includes an acoustic system 12 having, in addition to the acoustic control ECU 14, a sound source 16, an adder 18, a pair of amplifiers 20f, 20r, a plurality of front speakers 22, and a plurality of rear speakers 24.

The acoustic control ECU 14 may have, in addition to the function of the ASC apparatus, the function of an active noise control apparatus (hereinafter referred to as "ANC apparatus"). The ANC apparatus may be of a configuration disclosed in U.S. Patent Application Publication No. 2004/0247137 and U.S. Pat. No. 7,062,049, for example.

When the ECU 14 functions as the ASC apparatus, it outputs a control signal Sc2 (amplitude adjustment control signal) representing a sound effect that is synchronous with a muffled engine sound (pseudo-engine sound).

The sound source 16, which comprises an audio device and/or navigation device, outputs an audio signal Sau representing music and/or route guidance voice to the adder 18.

The adder 18 combines the control signal Sc2 from the ECU 14 and the audio signal Sau from the sound source 16 into a control signal Sc3, which is applied through the amplifier 20f to the front speakers 22. The amplifier 20r amplifies a control signal Sc4 from the ECU 14 and outputs the amplified control signal Sc4 to the rear speakers 24.

The front speakers 22 are installed near a front seat 26 (e.g., driver's seat) of the vehicle 10, for example, in front door panels on both sides, kick panels on both sides (e.g., panels on a side of a driver's leg space and a side of another leg space), or in a roof above the driver's seat 26. The front speakers 22 output a front control sound CSf represented by the control signal Sc3 from the adder 18 toward a driver 28 seated on the front seat 26. When the ECU 14 functions as the ANC device, the front speakers 22 output the front control sound CSf as a canceling sound for canceling the muffled engine sound. When the ECU 14 functions as the ASC device, the front speakers 22 output the front control sound CSf as a sound effect representing a pseudo-engine sound.

The rear speakers 24 are installed near rear seats, not shown, of the vehicle 10, e.g., in rear door panels on both sides or a roof above the rear seats. The rear speakers 24 output a rear control sound CSr represented by the control signal Sc4 from the ECU 14 toward the driver 28. When the ECU 14 functions as the ANC device, the rear speakers 24 output the rear control sound CSr as a canceling sound for canceling the muffled engine sound. When the ECU 14 functions as the ASC device, the rear speakers 24 output the rear control sound CSr as a sound effect representing a pseudo-engine sound.

(1-2. Acoustic Control ECU 14)
(1-2-1. Overall Arrangement)

As shown in FIG. 1, the ECU 14 (vehicular active sound effect generating apparatus) has an engine rotational frequency detector 30 (hereinafter also referred to as "fe detector 30"), an ASC circuit 32, and digital/analog converters 34f, 34r (hereinafter also referred to as "D/A converters 34f, 34r").

The fe detector 30 (rotational frequency detecting unit) detects an engine rotational frequency fe [Hz] based on engine pulses Ep from a fuel injection controller {hereinafter referred to as "FI ECU" (Fuel Injection Electronic Control Unit)}, not shown, that controls fuel injection in an engine 100 (see FIG. 2). The fe detector 30 outputs the detected engine rotational frequency fe to the ASC circuit 32.

The ASC circuit 32 generates a sound effect representing a pseudo-engine sound to enhance an acoustic effect in the passenger compartment of the vehicle 10, e.g., to intensify a speed change of the vehicle 10.

As shown in FIG. 1, the ASC circuit 32 generates an output signal, i.e., the control signal Sc2, for the front speakers 22 and an output signal, i.e., the control signal Sc4, for the rear speakers 24. The control signal Sc2 is converted into an analog control signal Sc2 by the D/A converter 34f. The analog control signal Sc2 is output to the adder 18. The control signal Sc4 is converted into an analog control signal Sc4 by the D/A converter 34r. The analog control signal Sc4 is output to the amplifier 20r.

(1-2-2. Details of ASC Circuit 32)
(1-2-2-1. Overall Arrangement of ASC Circuit 32)

As shown in FIG. 1, the ASC circuit 32 includes multipliers 40, 42, 44, reference signal generators 46a, 46b, 46c, a waveform data table 48, a control signal generator 58 (control signal generating unit) having first acoustic correctors 50a, 50b, 50c, second acoustic correctors 52a, 52b, 52c, and third acoustic correctors 54a, 54b, 54c, a frequency change detector 60 (hereinafter also referred to as "Δaf detector 60"), an entire sound volume corrector 62, and a rear sound volume corrector 64. The above components of the ASC circuit 32, except for the entire sound volume corrector 62 and the rear sound volume corrector 64, may be those disclosed in U.S. Patent Application Publication No. 2006/0215846 (hereinafter referred to as "US2006/0215846A1") and/or US2009/0028353A1 (see FIG. 12 of US2006/0215846A1 and/or FIG. 1 of US2009/0028353A1).

The multipliers 40, 42, 44 generate harmonic signals having frequencies which are represented by predetermined degrees (multiples) of the engine rotational frequency fe. Specifically, the multiplier 40 generates an $O_1$-degree, e.g., second, harmonic signal, the multiplier 42 an $O_2$-degree, e.g., third, harmonic signal, and the multiplier 44 an $O_3$-degree, e.g., fourth, harmonic signal.

The reference signal generators 46a, 46b, 46c (reference signal generating unit) generate reference signals Sr1, Sr2, Sr3, respectively, based on the harmonic signals from the multipliers 40, 42, 44 and waveform data stored in the waveform data table 48, and output the generated reference signals Sr1, Sr2, Sr3 to the first acoustic correctors 50a, 50b, 50c, respectively.

The first acoustic correctors 50a, 50b, 50c perform, on the reference signals Sr1, Sr2, Sr3, a planarizing process for generating a control sound CS as a sound effect that is felt as linear with respect to the driver's action to accelerate the vehicle 10, at the ears of the driver 28 (see paragraphs [0069] through [0076] of US2006/0215846A1). The second acoustic correctors 52a, 52b, 52c perform, on the reference signals Sr1, Sr2, Sr3, a frequency intensifying process for intensifying only a desired frequency of the control sound CS as the sound effect (see paragraphs [0079] through [0082] of US2006/0215846A1). The third acoustic correctors 54a, 54b, 54c perform a degree-dependent correcting process for correcting the reference signals Sr1, Sr1, Sr3 depending on the degrees (see paragraph [0088] of US2006/0215846A1).

The reference signals Sr1, Sr2, Sr3 that have been processed by the first acoustic correctors 50a, 50b, 50c, the second acoustic correctors 52a, 52b, 52c, and the third acoustic correctors 54a, 54b, 54c are combined into a control signal Sc1 by an adder 56.

The Δaf detector 60 (rotational frequency change calculating unit) detects a change per unit time in the engine rotational frequency fe (hereinafter referred to as "frequency change Δaf") [Hz/s] based on the engine rotational frequency fe from the fe detector 30, and outputs the detected frequency change Δaf to the entire sound volume corrector 62.

The entire sound volume corrector 62 (amplitude-adjusted control signal generating unit) corrects the sound volumes of the front control sound CSf and the rear control sound CSr (sound effects) depending on the operating state of the engine 100 (see FIG. 2), the operated state of an accelerator pedal 102, and the shifted position of a gearshift lever, not shown (hereinafter referred to as "shifted position Ps"). The rear sound volume corrector 64 corrects the sound volumes and output timing of the rear speakers 24 depending on the depressed state of the accelerator pedal 102.

(1-2-2-2. Details of Entire Sound Volume Corrector 62)

As described above, the entire sound volume corrector 62 corrects the front control sound CSf (sound effect) output by the front speakers 22 and the rear control sound CSr (sound effect) output by the rear speakers 24 depending on the operating state of the engine 100, the operated state of the accelerator pedal 102, and the shifted position Ps. The operating state of the engine 100 is represented by the engine rotational frequency fe and the frequency change Δaf. The operated state of the accelerator pedal 102 is represented by the angle [°] through which the accelerator pedal 102 is depressed (hereinafter referred to as "accelerator opening θap"), detected by an accelerator opening sensor 82 (see FIG. 1) as an accelerator opening detecting unit. The shifted position Ps is detected by a gearshift position sensor 84.

The entire sound volume corrector 62 has a first gain setter 70, a second gain setter 72, a third gain setter 74, a multiplier 76, an adder 78, and an entire sound volume correction filter 80.

The first gain setter 70 sets a gain (hereinafter referred to as "frequency change gain GΔaf" or "first gain GΔaf") based on a shift position Ps and a frequency change Δaf. Specifically, maps representing the relationship between frequency changes Δaf and first gains GΔaf are established in advance for respective different shift positions Ps (first, second, and third gear positions, etc.). One of the maps is selected based on a shift position Ps indicated by the shift position sensor 84. Using the selected map, the first gain setter 70 sets a first gain GΔaf based on the frequency change Δaf detected by the Δaf detector 60.

The second gain setter 72 sets a gain ((hereinafter referred to as "frequency gain Gfe" or "second gain Gfe") based on an engine rotational frequency fe. Specifically, a map representing the relationship between engine rotational frequencies fe and second gains Gfe is established in advance. Using the map, the second gain setter 72 sets a second gain Gfe based on the engine rotational frequency fe detected by the fe detector 30.

The third gain setter 74 sets a gain (hereinafter referred to as "accelerator opening gain Gap" or "third gain Gap") based on an accelerator opening θap. Specifically, a map representing the relationship between accelerator openings θap and third gains Gap is established in advance. Using the map, the third gain setter 74 sets a third gain Gap based on the accelerator opening θap detected by the accelerator opening sensor 82.

As described above, the third gain Gap is a gain that is set based on the accelerator opening θap. Therefore, even if there is a deviation between the accelerator opening θap and the engine rotational frequency fe when the vehicle 10 travels uphill or downhill, it is possible to generate sound effects (front control sound CSf and rear control sound CSr) taking into account how the accelerator pedal 102 is operated by the driver 28.

For example, when the vehicle 10 runs uphill, the engine rotational frequency fe increases little even if the driver 28 depresses the accelerator pedal 102 deeply. However, a large sound effect can be produced depending on the accelerator opening θap for an enhanced acoustic effect in the passenger compartment. Conversely, when the vehicle 10 runs downhill, the engine rotational frequency fe increases greatly even if the driver 28 depresses the accelerator pedal 102 little. However, since a small sound effect is produced depending on the accelerator opening θap, it is possible to keep the passenger compartment quiet.

A deviation between the accelerator opening θap and the engine rotational frequency fe may possibly occur if the vehicle 10 incorporates a system wherein the engine 100 is not directly connected to the accelerator pedal 102 and hence is not mechanically controlled by the accelerator pedal 102, but is electrically controlled based on a signal related to the accelerator pedal 102 (so-called "steer-by-wire technology"), or a transmission that utilizes an optimum engine rotational frequency fe depending on the running state of the vehicle 10, such as a continuously variable transmission (CVT). In case the vehicle 10 incorporates such a steer-by-wire technology or transmission, it is also possible to generate sound effects (front control sound CSf and rear control sound CSr) taking into account how the accelerator pedal 102 is depressed by the driver 28, by using the third gain Gap.

The multiplier 76 multiplies the second gain Gfe (rotational frequency gain Gfe) set by the second gain setter 72 by the third gain Gap (accelerator opening gain Gap) set by the third gain setter 74, and outputs the product to the adder 78.

The adder 78 (fourth gain setter) adds the first gain GΔaf (frequency change gain GΔaf) set by the first gain setter 70 to the product determined by the multiplier 76 of the second gain Gfe set by the second gain setter 72 and the third gain Gap set by the third gain setter 74, thereby calculating a sum gain (hereinafter referred to as "common corrective gain Gcom" or "fourth gain Gcom").

The entire sound volume correction filter 80 multiplies the control signal Sc1 from the adder 56 by the fourth gain Gcom calculated by the adder 78, generating a control signal Sc2 (amplitude adjustment control signal). The entire sound volume correction filter 80 outputs the generated control signal Sc2 to the D/A converter 34f and the rear sound volume corrector 64.

As described above, the entire sound volume corrector 62 corrects the control signal Sc1 to generate the control signal Sc2, using the engine rotational frequency fe and the frequency change Δaf, which represent the operating state of the engine 100, the accelerator opening θap representing the operated state of the accelerator pedal 102, and the shift position Ps.

(1-2-2-3. Details of Rear Sound Volume Corrector 64)

As described above, the rear sound volume corrector 64 corrects the sound volume and output timing of the rear speakers 24 depending on the operated state of the accelerator pedal 102. The operated state of the accelerator pedal 102 is represented by the accelerator opening θap detected by the accelerator opening sensor 82.

The rear sound volume corrector 64 has an accelerator opening change detector 90 (hereinafter also referred to as "Δθap detector 90"), a delay setter 92, a delay filter 94, a fifth gain setter 96, and a rear sound volume correction filter 98 (hereinafter also referred to as "filter 98").

The Δθap detector 90 detects a change per unit time in the accelerator opening θap (hereinafter also referred to as "accelerator opening change Δθap") [°/s] based on the accelerator opening θap detected by the accelerator opening sensor 82, and outputs the detected accelerator opening change Δθap to the delay setter 92.

The delay setter 92 sets a delay (hereinafter referred to as "rear speaker delay Zr" or "delay Zr") based on the accelerator opening change Δθap. Specifically, a map representing the relationship between accelerator opening changes Δθap and delays Zr is established in advance. Using the map, the delay setter 92 sets a delay Zr based on the accelerator opening change Δθap detected by the Δθap detector 90.

According to the present embodiment, when the accelerator opening change Δθap exceeds a predetermined threshold value (hereinafter referred to as "threshold value TH_Δθap"), the delay setter 92 generates a delay D. If the threshold value TH_Δθap is a positive value, then the delay setter 92 can generate a delay D only when the driver 28 depresses the accelerator pedal 102.

The delay filter 94 adds the delay Zr calculated by the delay setter 92 to the control signal Sc2 from the entire sound volume correction filter 80, and then outputs the control signal Sc2 with the delay Dr to the rear sound volume correction filter 98.

As described above, the delay Zr is a delay that is set based on the accelerator opening change Δθap. Therefore, when the driver 28 depresses the accelerator pedal 102 greatly, then the sound effect produced by the rear speakers 24 is delayed from the sound effect produced by the front speakers 22, thereby enhancing an acceleration feel which the driver 28 has.

The fifth gain setter 96 sets a gain (hereinafter referred to as "pedal operating gain Gr" or "fifth gain Gr") based on the accelerator opening θap. Specifically, a map representing the relationship between accelerator openings θap and fifth gains Gr is established in advance. Using the map, the fifth gain setter 96 sets a fifth gain Gr based on the accelerator opening θap detected by the accelerator opening sensor 82.

The fifth gain Gr is used with respect to the sound effect produced by the rear speakers 24. The sound effect produced by the rear speakers 24 is felt natural when it is not as strong as the sound effect produced by the front speakers 22. According to the present embodiment, therefore, the fifth gain Gr is set such that sound effect produced by the rear speakers 24 is not as strong as the sound effect produced by the front speakers 22 (see FIG. 4). More specifically, the fifth gain Gr is set to a value smaller than 1.

The fifth gain Gr is a gain that is set for the rear speakers 24 based on the accelerator opening θap. Consequently, it is possible to control the amplitude (hereinafter referred to as "amplitude Ar") of the sound effect produced by the rear speakers 24 depending on how the accelerator pedal 102 is operated by the driver 28.

The rear sound volume correction filter 98 multiplies the control signal Sc2 to which the delay Zr is added by the delay filter 94, by the fifth gain Zr set by the fifth gain setter 96, thereby generating a control signal Sc4. The rear sound volume correction filter 98 outputs the generated control signal Sc4 to the D/A converter 34r.

As described above, the rear sound volume corrector 64 corrects the control signal Sc2 to generate the control signal Sc4, using the accelerator opening θap (and the accelerator opening change Δθap based thereon) representing the pressed state of the accelerator pedal 102.

2. Processing by Rear Sound Volume Corrector 64:

A processing operation of the rear sound volume corrector 64 will be described in greater detail below.

Figure 2:
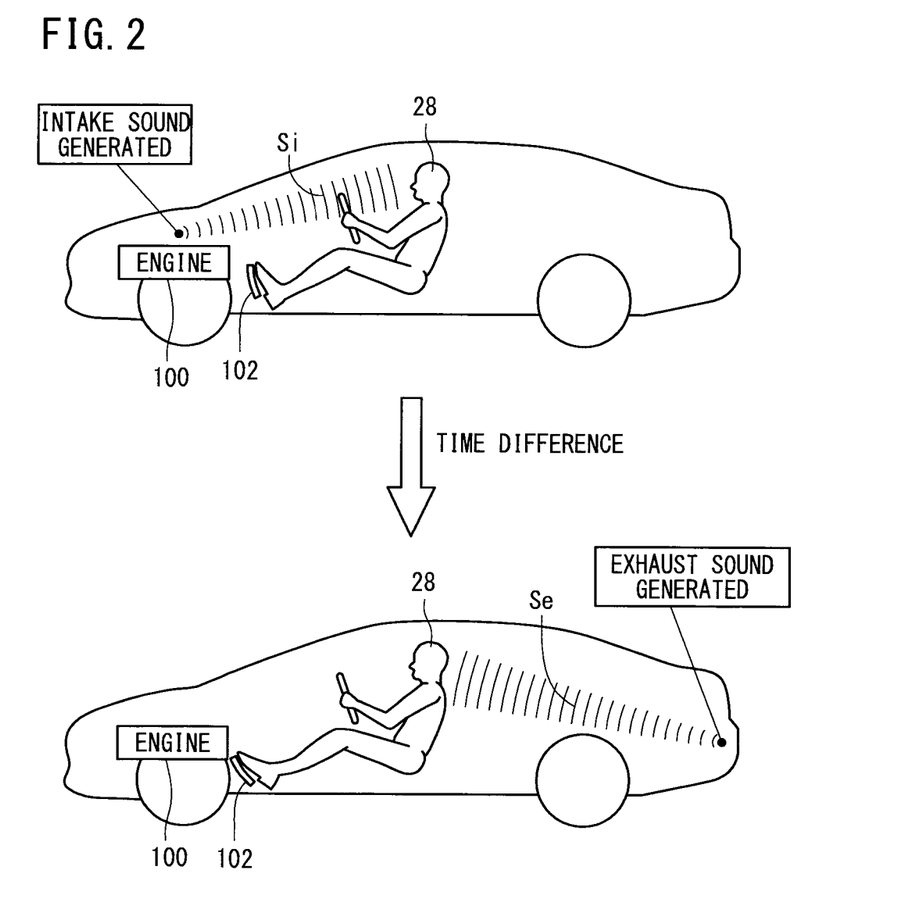
FIG. 2 is a view illustrating the timings of generating an intake sound and an exhaust sound of an engine when an accelerator pedal is depressed.
Figure 3:
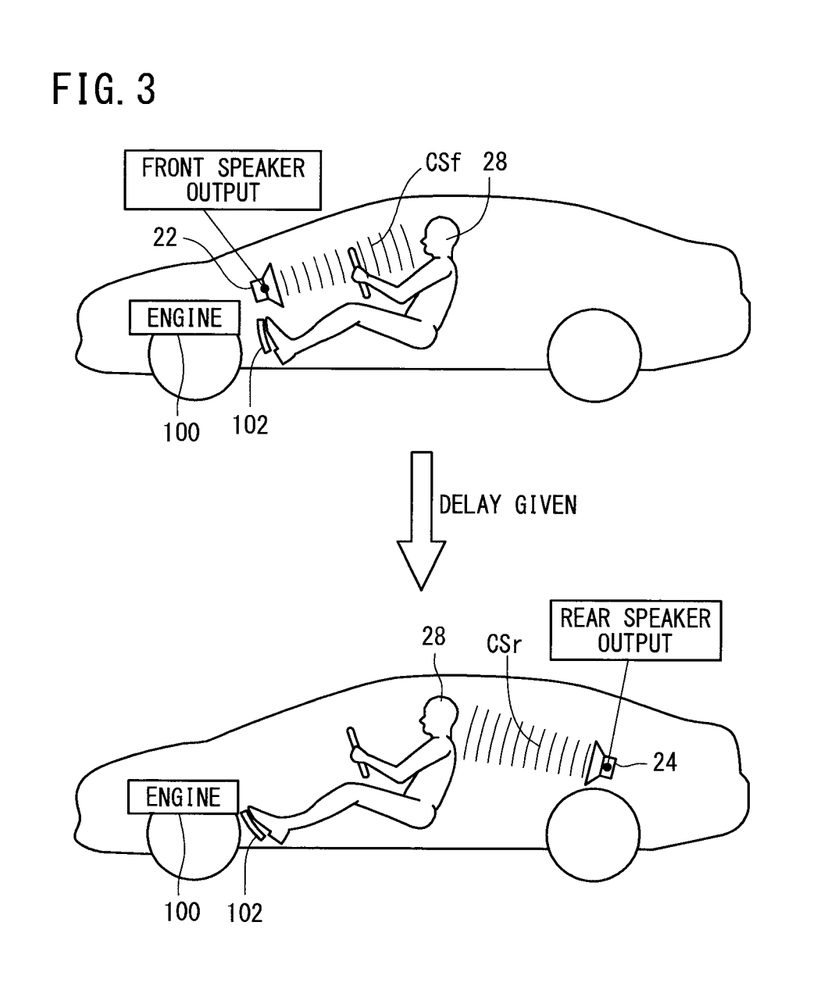
FIG. 3 is a view illustrating a delay produced between a sound effect (front control sound) generated by front speakers and a sound effect (rear control sound) generated by rear speakers.
Figure 4:
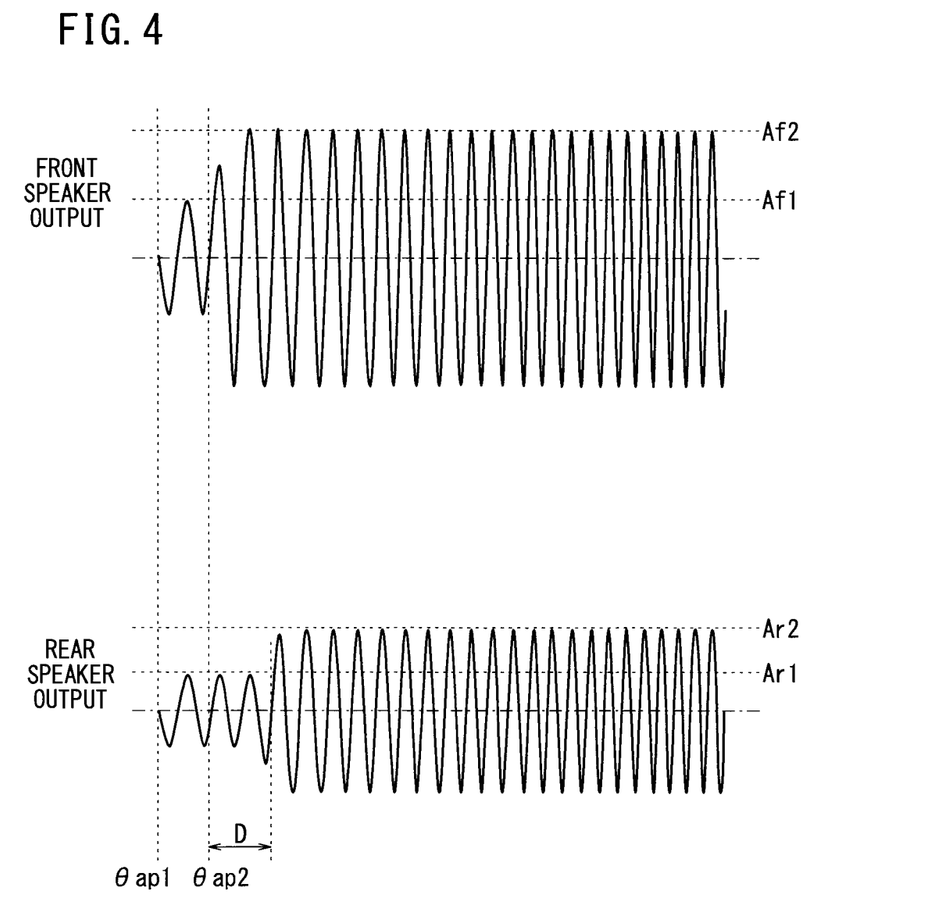
FIG. 4 is a diagram illustrating the difference between an output sound from the front speakers and an output sound from the rear speakers.

FIG. 2 is a view illustrating the timings of generating an intake sound Si and an exhaust sound Se of the engine 100 when the accelerator pedal 102 is depressed. FIG. 3 is a view illustrating a delay D produced between the sound effect (front control sound CSf) generated by the front speakers 22 and the sound effect (rear control sound CSr) generated by the rear speakers 24 when the accelerator pedal 102 is depressed. FIG. 4 is a diagram illustrating the difference between an output sound from the front speakers 22 and an output sound from the rear speakers 24.

(2-1. Time Difference Between Intake Sound Si and Exhaust Sound Se)

As shown in FIG. 2, there is a time difference developed between the intake sound Si and the exhaust sound Se. Specifically, air that is introduced into the engine 100 through an intake manifold, etc., not shown, is subsequently discharged from the engine 100 through an exhaust manifold, etc. Therefore, if attention is focused on a flow of air from the intake manifold through the engine 100 to the exhaust manifold, a time difference is developed between the intake sound Si and the exhaust sound Se which are produced by the same air.

Therefore, when the amount of intake air and the amount of exhaust air are changed by the driver 28 depressing the accelerator pedal 102, an increase in the exhaust sound Se appears with a delay from an increase in the intake sound Si.

(2-2. Delay D to Occur Between Front Control Sound CSf and Rear Control Sound CSr)

As described above, a time difference is developed between the intake sound Si and the exhaust sound Se. As shown in FIG. 3, in view of the time difference, the ASC circuit 32 (rear sound volume corrector 64) according to the present embodiment imparts a delay D to the sound effect from the rear speakers 24 (rear control sound CSr) with respect to the sound effect from the front speakers 22 (front control sound CSf).

For example, as shown in FIG. 4, if the accelerator opening θap changes from θap1 to θap2, then a delay D is generated depending on the change in the accelerator opening θap (accelerator opening change Δθap). Therefore, when the driver 28 depresses the accelerator pedal 102 greatly, for example, the sound effect from the rear speakers 24 is output with a delay from the sound effect from the front speakers 22, thus enhancing an acceleration feel which the driver 28 has. The delay D may not necessarily be the same as the time difference between the actual intake sound Si and the actual exhaust sound Se, but may be different from the time difference, i.e., may be longer or shorter than the time difference, to produce a desired sound effect for an enhanced acceleration feel.

According to the present embodiment, as described above, when the accelerator opening change Δθap exceeds the threshold value TH_Δθap, a delay D is produced. If the threshold value TH_Δθap is set to a positive value, then a delay D is produced only when the driver 28 depresses the accelerator pedal 102 for accelerating the vehicle 10.

(2-3. Setting of Fifth Gain Gr)

The sound effect produced by the rear speakers 24 is felt natural when it is not as strong as the sound effect produced by the front speakers 22. Since the fifth gain Gr is used with respect to the sound effect produced by the rear speakers 24, the fifth gain Gr according to the present embodiment is set such that sound effect produced by the rear speakers 24 is not as strong as the sound effect produced by the front speakers 22.

For example, as shown in FIG. 4, when the accelerator opening θap is θap1, the amplitude Ar1 of the rear control sound CSr is smaller than the amplitude Af1 of the front control sound CSf. When the accelerator opening θap is θap2, the amplitude Ar2 of the rear control sound CSr is smaller than the amplitude Af2 of the front control sound CSf.

3. Advantages of the Present Embodiment:

According to the present embodiment, as described above, a delay D depending on the accelerator opening change Δθap is added to the sound effect output from the rear speakers 24 (rear control sound CSr). Therefore, it is possible to produce a sound effect that reflects how the accelerator pedal 102 is operated by the driver 28. For example, if the accelerator opening θap changes sharply, then the sound effect from the rear speakers 24 (rear control sound CSr) is output with a delay with respect to the sound effect from the front speakers 22 (front control sound CSf), thus outputting a sound effect taking into account the time difference between the intake sound Si and the exhaust sound Se and also enhancing a sound source movement feel (acceleration feel) which the driver 28 has.

According to the present embodiment, the rear sound volume corrector 64 of the ASC circuit 32 gives a delay D to the sound effect produced by the rear speakers 24 when the accelerator opening change Δθap exceeds the threshold value TH_Δθap. Consequently, a delay D is produced only when the driver 28 depresses the accelerator pedal 102.

According to the present embodiment, the rear sound volume corrector 64 of the ASC circuit 32 changes the amount of a delay D given to the sound effect produced by the rear speakers 24 (rear control sound CSr), depending on the magnitude of the accelerator opening change Δθap. It is thus possible to reflect the operated state of the accelerator pedal 102 more in the delay D for thereby producing an enhanced sound effect.

According to the present embodiment, the amplitude Ar of the sound effect from the rear speakers 24 is set to a value smaller than the amplitude Af of the sound effect from the front speakers 22 (see FIG. 4). Usually, sounds related to the actual operation of the engine 100 (intake sound Si, exhaust sound Se, etc.) are stronger from a front portion of the vehicle 10 than from a rear portion of the vehicle 10. Therefore, the above amplitude setting makes it possible to produce a more natural sound effect.

According to the present embodiment, the entire sound volume corrector 62 of the ASC circuit 32 adjusts the amplitude of the control signal Sc1 depending on the engine rotational frequency change Δaf, the engine rotational frequency fe, and the accelerator opening θap (see FIG. 1). It is thus possible to output a sound effect (front control sound CSf and rear control sound CSr) which reflects both the operating state of the engine 100 and the operated state of the accelerator pedal 102.

According to the present embodiment, the magnitude of the sound effects (acceleration sound, etc.) output from the front speakers 22 and the rear speakers 24 is determined based on the first gain GΔaf for the engine rotational frequency change Δaf which represents the operating state of the engine 100 and the third gain Gap for the accelerator opening θap which represents how the driver 28 operates the accelerator pedal 102. The third gain Gap based on the accelerator opening θap is weighed depending on the engine rotational frequency fe by being multiplied by the second gain Gfe based on the engine rotational frequency fe. Therefore, the two gains GΔaf, Gap which represent the operating state of the engine 100 and the operated state of the accelerator pedal 102 are generated parallel to each other, and the magnitude of a sound effect (acceleration sound, etc.) is determined by the sum of the gains GΔaf, Gap.

Consequently, the sound effect that is produced when the engine rotational frequency fe changes little even if the accelerator pedal 102 is depressed deeply, i.e., the accelerator opening θap is large, at the time the vehicle 10 is going uphill, is prevented from becoming unnecessarily small. The sound effect that is produced when the engine rotational frequency fe changes greatly even if the accelerator pedal 102 is not depressed deeply, i.e., the accelerator opening θap is small, at the time the vehicle 10 is going downhill, is prevented from becoming unnecessarily large. Therefore, a more natural sound effect (acceleration sound, etc.) can be produced.

[B. Applications of the Invention]

The present invention is not limited to the above embodiment, but may adopt various arrangements based on the disclosure of the present description. For example, the present invention may adopt the following arrangements:

1. Target Sounds:

In the above embodiment, the vehicle 10 comprises a gasoline-powered vehicle, and the control sounds CSf, CSr as the sound effects output from the front speakers 22 and the rear speakers 24 represent a pseudo-engine sound. However, the sound effect is not limited to the pseudo-engine sound, as long as it is a pseudo-operating sound of a drive source. If the vehicle 10 comprises an electric vehicle, then the control sounds CSf, CSr may represent a pseudo-propulsive-motor sound, and if the vehicle 10 comprises a fuel battery vehicle, then the control sounds CSf, CSr may represents a pseudo-compressor sound.

2. Entire Sound Volume Corrector 62:

In the above embodiment, the fourth gain Gcom is set depending on a combination of the rotational frequency change Δaf, the engine rotational frequency fe, the accelerator opening θap, and the shift position Ps. However, the fourth gain Gcom may be set depending on one, two, or three of the rotational frequency change Δaf, the engine rotational frequency fe, the accelerator opening θap, and the shift position Ps.

Alternatively, in setting the fourth gain Gcom, a vehicle speed V [km/h] of the vehicle 10 may be used instead of the engine rotational frequency fe, or a vehicle speed change Δav [km/h/s] may be used instead of the rotational frequency change Δaf. In particular, if the vehicle speed V is used to adjust the gain of a reference signal or a control signal as disclosed in US2009/0028353A1 (see FIG. 1 thereof), then at least one of the vehicle speed V and the vehicle speed change Δav should preferably be used.

Alternatively, if the vehicle 10 comprises an electric vehicle, then the fourth gain Gcom may be set based on either one or both of the rotational frequency [Hz] of the traction motor of the vehicle 10 and the rotational frequency change [Hz/s] of the traction motor.

Further alternatively, if attention should be focused on the processing operation of the rear sound volume corrector 64 or the like, then the entire sound volume corrector 62 may be dispensed with.

3. Rear Sound Volume Corrector 64:

(3-1. Delaying Process by Delay Filter 94)

In the above embodiment, the rear sound volume corrector 64 has the delay filter 94 for adding the delay D and the rear sound volume correction filter 98 for adjusting the amplitude. If emphasis is to be placed on adding the delay D, then the amplitude adjustment by the rear sound volume correction filter 98 may be dispensed with. Conversely, if emphasis is to be placed on adjusting the amplitude by the rear sound volume correction filter 98, then the addition of the delay D by the delay filter 94 may be dispensed with. If attention should be focused on the processing operation of the entire sound volume corrector 62, then the rear sound volume corrector 64 may be dispensed with.

In the above embodiment, the amount of the delay D is changed based on the accelerator opening change Δθap (see the delay setter 92 shown in FIG. 1). However, another approach may be possible insofar as the delay D is set depending on the accelerator opening change Δθap. For example, the amount of the delay D may be of a fixed value, and when the accelerator opening change Δθap exceeds a predetermined threshold value (hereinafter referred to as "threshold value TH_Δθap2"), the delay D (fixed value) may be generated, and when the accelerator opening change Δθap is smaller than the threshold value TH_Δθap2, the delay D may not be generated.

In the above embodiment, the delay D used in the delay filter 94 is set based on the accelerator opening change Δθap. However, the delay D may be set according to different processes insofar as it is based on the operated state of the accelerator pedal 102. For example, the delay D may be changed based on the accelerator opening θap in addition to or instead of the accelerator opening change Δθap. This process makes it possible to keep the delay D at a maximum level when the accelerator pedal 102 is continuously depressed to its maximum stroke, thus producing a sound effect according to a new approach.

(3-2. Amplitude Adjustment by Rear Sound Volume Correction Filter 98)

In the above embodiment, the rear sound volume correction filter 98 changes the fifth gain Gr (pedal operating gain Gr) depending on the accelerator opening θap. If this process is not important, the fifth gain Gr may be of a fixed value, or the amplitude adjustment by the rear sound volume correction filter 98 may be dispensed with.

The fifth gain Gr according to the above embodiment is set to 1 or smaller so that the sound effect produced by the rear speakers 24 is smaller than the sound effect produced by the front speakers 22. However, the fifth gain Gr may be allowed to be 1 or greater.

What is claimed is:

1. A vehicular active sound effect generating apparatus comprising:
    a waveform data table for storing waveform data of one period;
    a rotational frequency detecting unit for detecting a rotational frequency of an engine of a vehicle;
    a reference signal generating unit for generating a harmonic reference signal based on the rotational frequency by reading the waveform data from the waveform data table;
    a control signal generating unit for generating a control signal to generate a sound effect to be output into a passenger compartment of the vehicle, based on the reference signal;
    an accelerator opening detecting unit for detecting an accelerator opening of the vehicle;
    an amplitude-adjusted control signal generating unit for generating an amplitude-adjusted control signal by adjusting an amplitude of the control signal depending on the accelerator opening;
    a plurality of speakers for outputting the sound effect based on the amplitude-adjusted control signal;
    wherein the speakers include a front speaker positioned in a front portion of the vehicle and a rear speaker positioned in a rear portion of the vehicle; and
    a delay unit for giving a delay to a sound effect output from the rear speaker, such that the sound effect output from the rear speaker is delayed in comparison with a sound effect output from the front speaker, depending on both an accelerator opening change which represents a change per unit time in the accelerator opening and the accelerator opening itself,
    wherein the delay unit changes an amount of the delay given to the sound effect output from the rear speaker, depending on a magnitude of the accelerator opening change and the accelerator opening itself so as to reflect an operation of an accelerator pedal in the amount of the delay.

2. The vehicular active sound effect generating apparatus according to claim 1, wherein the delay unit gives a delay having a predetermined amount to the sound effect output from the rear speaker when the accelerator opening change exceeds a threshold value.

3. The vehicular active sound effect generating apparatus according to claim 1, wherein an amplitude of the sound effect output from the rear speaker is set to a value smaller than an amplitude of a sound effect output from the front speaker.

4. The vehicular active sound effect generating apparatus according to claim 1, wherein the amplitude-adjusted control signal generating unit adjusts the amplitude of the control signal depending on the rotational frequency and the accelerator opening.

5. The vehicular active sound effect generating apparatus according to claim 1, further comprising:
 a rotational frequency change calculating unit for calculating a rotational frequency change which represents a change per unit time in the rotational frequency;
 wherein the amplitude-adjusted control signal generating unit adjusts the amplitude of the control signal depending on the rotational frequency change and the accelerator opening.

6. The vehicular active sound effect generating apparatus according to claim 1, further comprising:
 an entire sound volume corrector for correcting a sound volume of the sound effect depending on a shifted position of a gearshift lever.

* * * * *